US012660298B2

(12) United States Patent
Wang et al.

(10) Patent No.: US 12,660,298 B2
(45) Date of Patent: Jun. 16, 2026

(54) METHOD FOR FORMING A CRYSTALLINE PROTECTIVE POLYSILICON LAYER

(71) Applicant: Taiwan Semiconductor Manufacturing Co., Ltd., Hsin-Chu (TW)

(72) Inventors: Cheng-Hung Wang, Hsin-Chu (TW); Tsung-Lin Lee, Hsin-Chu (TW); Wen-Chih Chiang, Hsin-Chu (TW); Kuan-Jung Chen, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 163 days.

(21) Appl. No.: 18/609,875

(22) Filed: Mar. 19, 2024

(65) Prior Publication Data

US 2024/0222197 A1 Jul. 4, 2024

Related U.S. Application Data

(60) Continuation of application No. 17/876,442, filed on Jul. 28, 2022, now Pat. No. 11,935,795, which is a
(Continued)

(51) Int. Cl.
*H10D 84/03* (2025.01)
*H10D 84/01* (2026.01)
(Continued)

(52) U.S. Cl.
CPC ....... *H10D 84/038* (2025.01); *H10D 84/0109* (2025.01); *H10D 84/401* (2025.01);
(Continued)

(58) Field of Classification Search
CPC ............. H10D 84/038; H10D 84/0109; H10D 84/401; H01L 21/02164; H01L 21/02532; H01L 21/02595; H01L 21/3065
See application file for complete search history.

(56) References Cited

U.S. PATENT DOCUMENTS

| | | | |
|---|---|---|---|
| 6,936,910 B2 | 8/2005 | Ellis-Monaghan et al. | |
| 8,987,145 B2 | 3/2015 | Nagakura | |
| (Continued) | | | |

FOREIGN PATENT DOCUMENTS

| | | |
|---|---|---|
| JP | 2005129949 A | 5/2005 |
| WO | 2012120857 A1 | 9/2012 |

OTHER PUBLICATIONS ip.com search (Year: 2026).*

*Primary Examiner* — Zandra V Smith
*Assistant Examiner* — Andre C Stevenson
(74) *Attorney, Agent, or Firm* — Harrity & Harrity, LLP

(57) ABSTRACT

Disclosed is a method for forming a crystalline protective polysilicon layer which does not create defective voids during subsequent processes so as to provide effective protection to devices underneath. In one embodiment, a method for forming a semiconductor device, includes: depositing a protective coating on a first polysilicon layer; forming an epitaxial layer on the protective coating; and depositing a second polysilicon layer over the epitaxial layer, wherein the protective coating comprises a third polysilicon layer, wherein the third polysilicon layer is deposited at a first temperature in a range of 600-700 degree Celsius, and wherein the third polysilicon layer in the protect coating is configured to protect the first polysilicon layer when the second polysilicon layer is etched.

20 Claims, 8 Drawing Sheets

Related U.S. Application Data division of application No. 17/021,727, filed on Sep. 15, 2020, now Pat. No. 11,508,628.

(51) Int. Cl.

| | |
|---|---|
| *H10D 84/40* | (2025.01) |
| *H10P 14/20* | (2026.01) |
| *H10P 14/692* | (2026.01) |
| *H10P 50/24* | (2026.01) |

(52) U.S. Cl.

CPC ...... *H10P 14/3411* (2026.01); *H10P 14/3456* (2026.01); *H10P 14/69215* (2026.01); *H10P 50/242* (2026.01)

(56) References Cited

U.S. PATENT DOCUMENTS

| | | | | |
|---|---|---|---|---|
| 11,508,628 | B2 * | 11/2022 | Wang | H10D 30/60 |
| 11,935,795 | B2 | 3/2024 | Wang et al. | |
| 2003/0134461 | A1 | 7/2003 | Su et al. | |
| 2005/0186765 | A1 | 8/2005 | Ma et al. | |
| 2006/0237766 | A1 | 10/2006 | Ahn | |
| 2011/0070712 | A1 | 3/2011 | Johnson et al. | |
| 2016/0218012 | A1 | 7/2016 | Shimamoto et al. | |
| 2019/0096771 | A1 | 3/2019 | Lin et al. | |
| 2019/0148396 | A1 | 5/2019 | Lee | |
| 2020/0194446 | A1 * | 6/2020 | Nishida | H10B 41/27 |
| 2020/0343266 | A1 * | 10/2020 | Reznicek | H10B 51/20 |

* cited by examiner

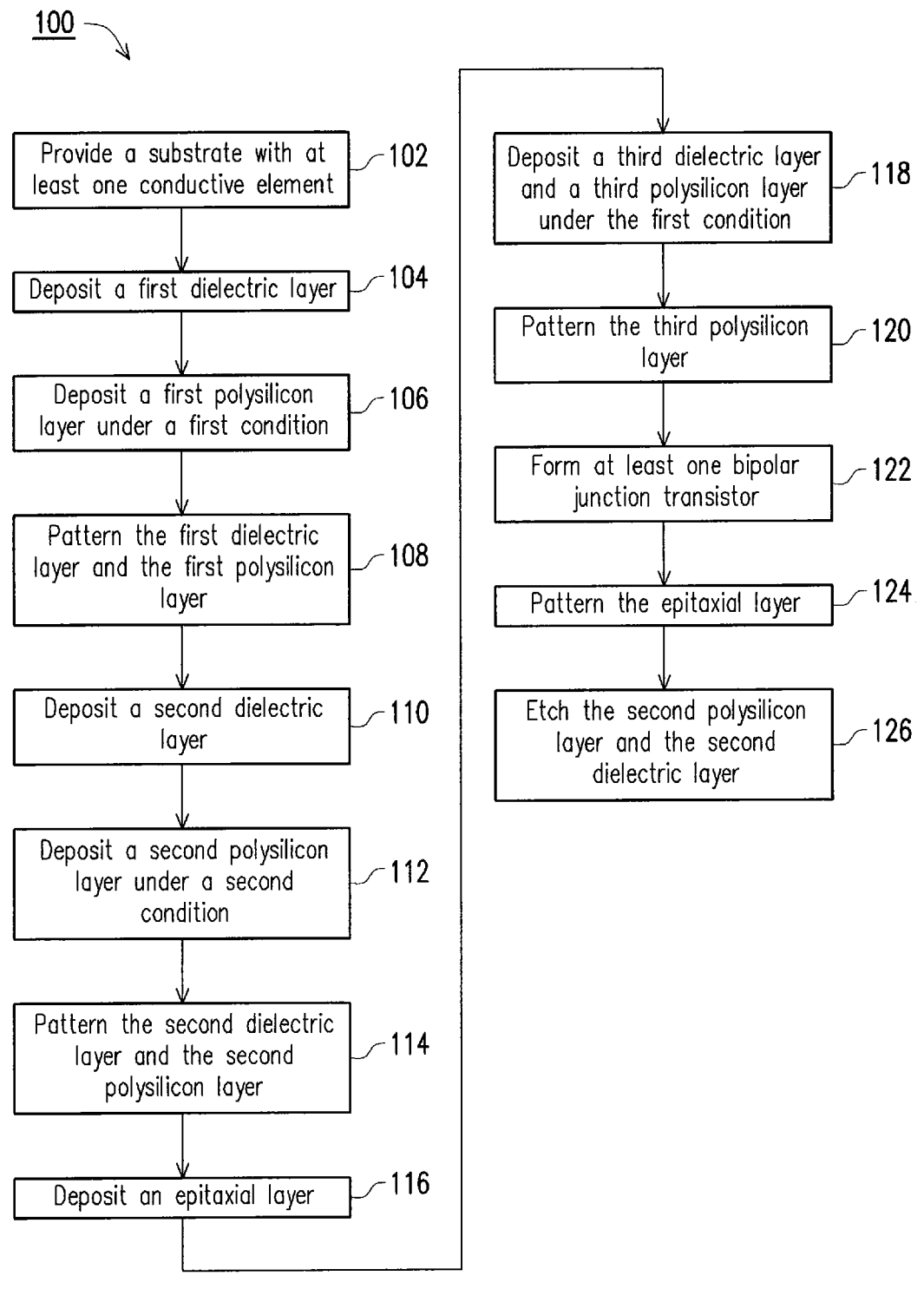

100

Provide a substrate with at least one conductive element — 102

Deposit a first dielectric layer — 104

Deposit a first polysilicon layer under a first condition — 106

Pattern the first dielectric layer and the first polysilicon layer — 108

Deposit a second dielectric layer — 110

Deposit a second polysilicon layer under a second condition — 112

Pattern the second dielectric layer and the second polysilicon layer — 114

Deposit an epitaxial layer — 116

Deposit a third dielectric layer and a third polysilicon layer under the first condition — 118

Pattern the third polysilicon layer — 120

Form at least one bipolar junction transistor — 122

Pattern the epitaxial layer — 124

Etch the second polysilicon layer and the second dielectric layer — 126

FIG. 1

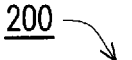
200
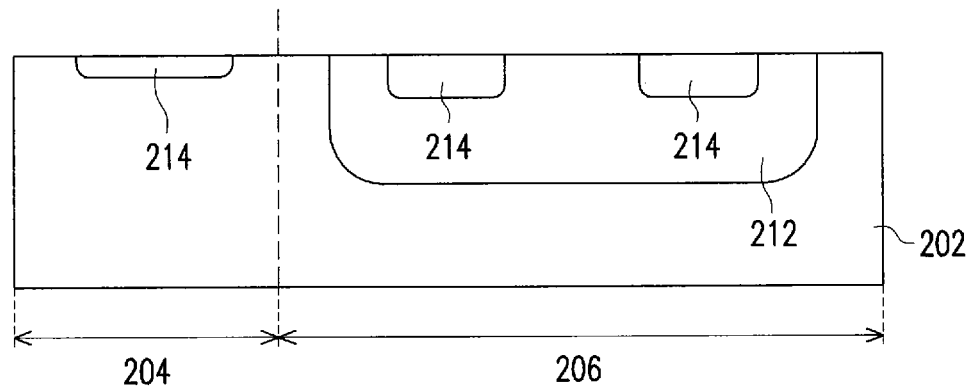
214
214        214
212        202
204        206
FIG. 2A
200
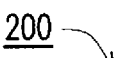
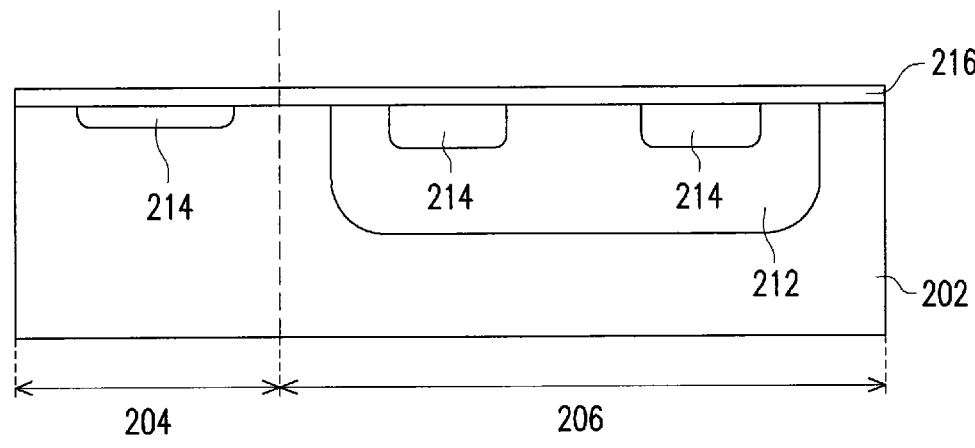
216
214
214        214
212        202
204        206
FIG. 2B

300

302 304

310

312 314

METHOD FOR FORMING A CRYSTALLINE PROTECTIVE POLYSILICON LAYER

CROSS-REFERENCE TO RELATED APPLICATIONS

This application is a continuation of U.S. patent application Ser. No. 17/876,442, filed Jul. 28, 2022, which is a division of U.S. patent application Ser. No. 17/021,727, filed Sep. 15, 2020, the contents of each are incorporated by reference in their entireties.

BACKGROUND

During fabrication of semiconductor devices, polycrystalline silicon (polysilicon) layers deposited at a deposition temperature in a range between 540 and 560 degree Celsius are amorphous and can recrystallize when being processed at a higher temperature than the deposition temperature. This recrystallization process can result in an increased grain size and cause a formation of defective voids in the polysilicon layers making semiconductor layers and devices under the polysilicon layers susceptible to process damages (e.g., plasma, etching, etc.). Therefore, there exists a need to develop a method for forming polysilicon layers that are inert to higher processing temperatures without creating defective voids so as to provide effective protection to semiconductor layers and devices underneath.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

FIG. 1 illustrates a flow chart of an exemplary method for forming a semiconductor device, in accordance with some embodiments of the present disclosure.

FIGS. 2A-2L illustrate cross-sectional views of an exemplary semiconductor device with a collimator during various fabrication stages, made by the method of FIG. 1, in accordance with some embodiments of the present disclosure.

DETAILED DESCRIPTION OF EXEMPLARY EMBODIMENTS

Figure 2C:
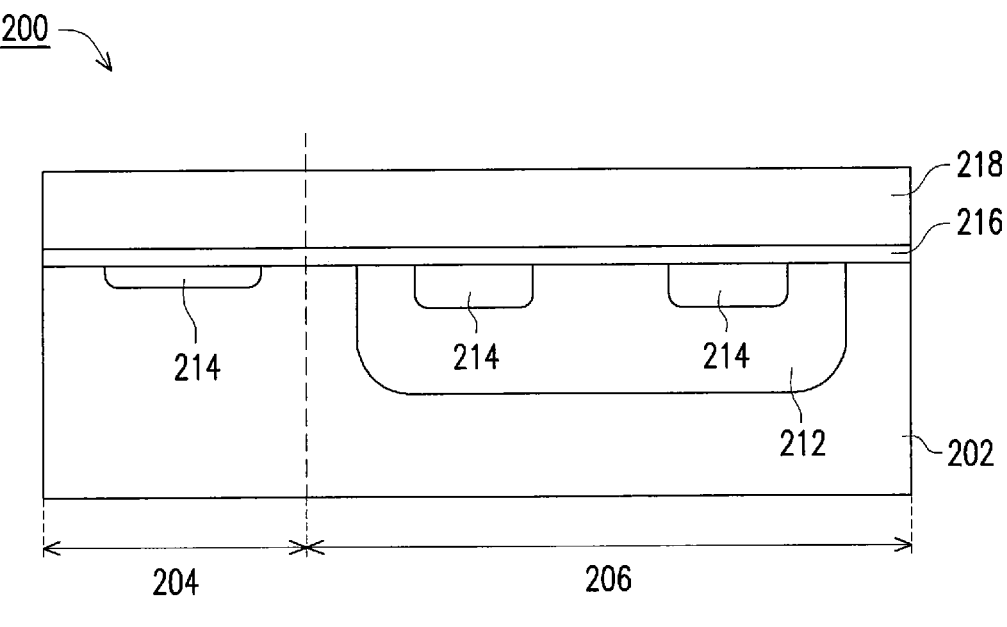

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

During fabrication of semiconductor devices, polycrystalline silicon (polysilicon) layers deposited at a deposition temperature in a range between 540 and 560 degree Celsius are amorphous and can recrystallize when being processed at a higher temperature than the deposition temperature. This recrystallization process can result in a larger grain size and cause a formation of defective voids in the polysilicon layers making semiconductor layers and devices under the polysilicon layers susceptible to process damages (e.g., plasma, etching, etc.). A method for forming polysilicon layers that are inert to higher processing temperatures without creating defective voids so as to provide effective protection to semiconductor layers and devices underneath, is disclosed.

FIG. 1 illustrates a flowchart of a method 100 to form a semiconductor device, in accordance with some embodiments of the present disclosure. It is noted that the method 100 is merely an example, and is not intended to limit the present disclosure. Accordingly, it is understood that additional operations may be provided before, during, and after the method 100 of FIG. 1, and that some other operations may only be briefly described herein. In some embodiments, operations of the method 100 may be associated with cross-sectional views of a semiconductor device at various fabrication stages as shown in FIGS. 2A-2L, respectively, which will be discussed in further detail below.

Referring now to FIG. 1, the method 100 starts with operation 102 in which a substrate is provided according to some embodiments. In some embodiments, the substrate comprises at least one conductive feature. The method 100 continues with operation 104 in which a first dielectric layer is deposited on a first surface of the substrate according to some embodiments. In some embodiments, the first dielectric layer is a gate oxide comprising silicon oxide. The method 100 continues with operation 106 in which a first polysilicon layer is deposited on the surface of the first dielectric layer under a first deposition condition according to some embodiments. In some embodiments, the first deposition condition comprises a first deposition temperature in a range of 600-700 degree Celsius.

The method 100 continues with operation 108 in which the first polysilicon layer and the first dielectric layer are patterned. In some embodiments, the first polysilicon layer and the first dielectric layer are patterned through a photolithography process followed by an etching process. In some embodiments, the patterned first polysilicon layer and the patterned first dielectric layer are aligned with conductive features in a first region of the substrate. In some embodiments, the patterned first polysilicon layer and the patterned first dielectric layer are configured as a gate terminal structure of a Complementary Metal Oxide Semiconductor (CMOS) transistor in the first region of the substrate. The method 100 continues with operation 110 in which a second dielectric layer is deposited on the surface of the patterned first polysilicon layer and on the first surface of the substrate according to some embodiments. In some embodiments, the second dielectric layer comprises silicon oxide. The method 100 continues with operation 112 in which a second polysilicon layer is deposited on the surface of the second dielectric layer under the first deposition condition according to some embodiments. In some embodiments, the first deposition condition comprises the first deposition temperature in a range of 600 and 700 degree Celsius.

The method 100 continues with operation 114 in which the second dielectric layer and the second polysilicon layer are patterned according to some embodiments. In some embodiments, the second dielectric layer and the second polysilicon layer are patterned to expose the first surface of the substrate in a second region. The method 100 continues with operation 116 in which an epitaxial (EPI) layer is grown on the first surface of the substrate in the second region and the surface of the second polysilicon layer in the first region according to some embodiments. In some embodiments, the EPI layer on the first surface of the substrate is for construction of at least one bipolar junction transistor (BJT) in the second region. The method 100 continues with operation 118 in which a third dielectric layer and a third polysilicon layer are deposited on the surface of the EPI layer according to some embodiments. In some embodiments, the third dielectric layer comprises silicon oxide. In some embodiments, the third polysilicon layer is deposited under a second deposition condition, wherein the second deposition condition comprises a second deposition temperature. In some embodiments, the second deposition temperature is in a range of 540 and 560 degrees Celsius, which allows for a lower cost and rapid deposition of an amorphous polysilicon layer.

The method 100 continues with operation 120 in which the third polysilicon layer is patterned according to some embodiments. In some embodiment, the third polysilicon layer is patterned through a photolithography process followed by an etching process. In some embodiments, the patterned third polysilicon layer is aligned with the conductive features in the second region as an emitter gate terminal of the BJT in the second region. The method 100 continues with operation 122 in which the BJT is constructed in the second region according to some embodiments. In some embodiments, the BJT is constructed through process steps including at least one of the following: fabrication of an emitter terminal and spacer, and removing the third dielectric layer using a buffered oxide etch (BOE) process. The method 100 continues with operation 124 in which the EPI layer is patterned according to some embodiments. In some embodiment, the EPI layer is patterned through a photolithography process followed by an etching process. In some embodiments, prior to the patterning of the EPI layer, the third dielectric layer is etched away using an etching process. In some embodiments, the patterned EPI layer is aligned with the BJT in the second region of the substrate. The method 100 continues with operation 126 in which the patterned second polysilicon layer is further etched away from the first region of the substrate. In some embodiments, the second dielectric layer is also patterned.

As mentioned above, FIGS. 2A-2L illustrate, in a cross-sectional view, a portion of a semiconductor device 200 at various fabrication stages of the method 100 of FIG. 1. The semiconductor device 200 may be included in an integrated circuit (IC). Also, FIGS. 2A-2L are simplified for a better understanding of the concepts of the present disclosure. Although the figures illustrate the semiconductor device 200, it is understood the IC may comprise a number of other devices such as resistors, capacitors, inductors, fuses, etc., which are not shown in FIGS. 2A-2L, for purposes of clarity of illustration.

FIG. 2A is a cross-sectional view of the semiconductor device 200 including a substrate 202 at one of the various stages of fabrication corresponding to operation 102 of FIG. 1, in accordance with some embodiments of the present disclosure. In some embodiments, the substrate 202 is a silicon (Si) substrate. Alternatively, the substrate 202 may include other elementary semiconductor material such as, for example, germanium (Ge). The substrate 202 may also include a compound semiconductor such as silicon carbide (SiC), gallium arsenic (GaAs), indium arsenide (InAs), and indium phosphide (InP). The substrate 202 may include an alloy semiconductor such as silicon germanium (SiGe), silicon germanium carbide (SiGeC), gallium arsenic phosphide (GaAsP), and gallium indium phosphide (GaInP). In one embodiment, the substrate 202 includes an epitaxial layer. For example, the substrate 202 may have an epitaxial layer overlying a bulk semiconductor. Furthermore, the substrate 202 may include a semiconductor-on-insulator (SOI) structure. For example, the substrate 202 may include a buried oxide (BOX) layer formed by a process such as separation by implanted oxygen (SIMOX) or other suitable technique, such as wafer bonding and grinding.

In the illustrated embodiment, the substrate 202 comprises a first region 204 and a second region 206, wherein the first region 204 and the second region 206 each comprises a plurality of conductive features 212/214. It should be noted that the substrate 202 can comprises a plurality of first regions 204 and a plurality of second regions 206, wherein each of the plurality of first regions 204 and each of the plurality of second regions 206 comprise a plurality of conductive features 212/214. In some embodiments, the conductive features 214 in the second region are further fabricated in a conductive feature 212. In some embodiments, the plurality of conductive features 212/214 comprises various p-type doped regions and/or n-type doped regions, implemented by a process such as ion implantation and/or diffusion. Each of the plurality of conductive features 212/214 is one of the following: n-well, p-well, lightly doped region (LDD), heavily doped source and drain (S/D), and various channel doping profiles configured to form various integrated circuit (IC) devices, such as a CMOS field-effect transistor (CMOS-FET) in the second region 206 and a BJT in the first region 204.

In some embodiments, the conductive features 212/214 are formed through a separate patterning (e.g., photolithography) process, which may involve various exposure, developing, backing, stripping, etching and rinsing processes. In some embodiments, the conductive features 212/214 are formed by using CVD, PVD, spin-on-coating and/or other suitable techniques to deposit conductive materials over a separately patterned photoresist layer, followed by a wet-etching of the photoresist layer.

The substrate 202 may further include other functional features such as a resistor or a capacitor formed in and on the substrate. The substrate 202 further includes lateral isolation features provided to separate various devices formed in the substrate 202, for example shallow trench isolation (STI). The various devices in the substrate 202 further include silicide disposed on S/D, gate and other device features for reduced contact resistance and enhance process compatibility when coupled between devices through local interconnections.

FIG. 2B is a cross-sectional view of the semiconductor device 200 including the substrate 202 and a first dielectric layer 216 at one of the various stages of fabrication corresponding to operation 104 of FIG. 1, in accordance with some embodiments of the present disclosure. In some embodiments, the first dielectric layer 216 comprises a material that is at least one of the following: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzo-cyclobutenes), SiLK (Dow Chemical, Midland, Mich.), polyimide, and/or other future developed low-k dielectric materials. In some embodiments, the first dielectric layer 216 is deposited using plasma enhanced chemical vapor deposition (PECVD) with a silane gas as a precursor gas. In some other embodiments, the first dielectric layer 216 is deposited using a physical vapor deposition (PVD) process. In some embodiments, the first dielectric layer 216 is formed from a thermal oxidation process.

FIG. 2C is a cross-sectional view of the semiconductor device 200 including the first dielectric layer 216 and a first polysilicon layer 218 at one of the various stages of fabrication corresponding to operation 106 of FIG. 1, in accordance with some embodiments of the present disclosure. In some embodiments, the first polysilicon layer 218 is deposited using Plasma Enhanced Chemical Vapor Deposition (PECVD). In some embodiments, the first polysilicon layer 218 is deposited under a first deposition condition, wherein the first deposition condition comprises a first temperature. In some embodiments, the first temperature is in a range of 600-700 degree Celsius.

Figure 2D:
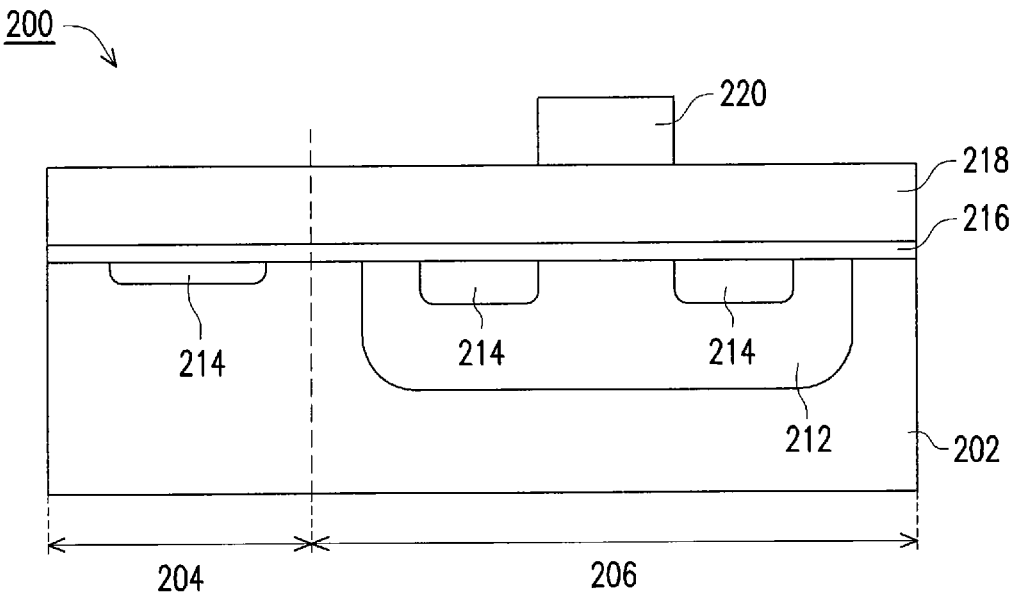

FIG. 2D is a cross-sectional view of the semiconductor device 200 in which a photoresist layer 220 is patterned on the first polysilicon layer 218 at one of the various stages of fabrication that corresponds to operation 108 of FIG. 1, in accordance with some embodiments of the present disclosure. As described below, the patterned photoresist layer 220 is used to mask an etching of the first polysilicon layer 218 and the first dielectric layer 216 to form a gate oxide and a gate terminal in the second region 206 of the substrate 202. Accordingly, in some embodiments, the patterned photoresist layer 220 is formed after a patterning (e.g., photolithography) process, to align the gate terminal structure (i.e., the gate oxide and the gate terminal) with the conductive features 212/214 in the second region 206 of the substrate 202.

In some embodiments, an initial photoresist layer 220 before the patterning process may include a negative or positive tone photoresist layer that is patternable in response to a photolithography light source. In some alternative embodiments, the initial photoresist layer 220 may include an e-beam (electron beam) resist layer (e.g., poly methyl methacrylate, methyl methacrylate, etc.) that is patternable in response to an e-beam lithography energy source. In some embodiments, the initial photoresist layer 220 is formed over the first polysilicon layer 218 using a deposition process known in the art such as spin-coating, spray-coating, dip-coating, roller-coating, or the like. The initial photoresist layer 220 is then patterned in a lithography process that may involve various exposure, developing, baking, stripping, etching, and rinsing processes. As a result, the patterned photoresist layer 220 is formed such that at least a portion of the top surface of the first polysilicon layer 218 is exposed, as shown in FIG. 2D.

Figure 2E:
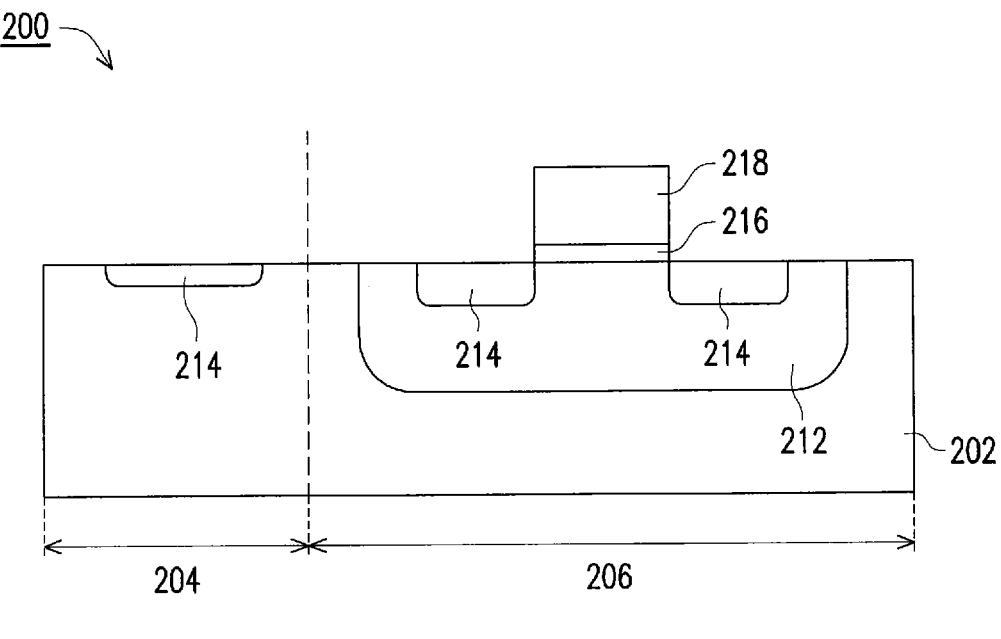

FIG. 2E is a cross-sectional view of the semiconductor device 200 including the patterned first polysilicon layer 218 and the patterned first dielectric layer 216 at one of the various stages of fabrication that corresponds to operation 108 of FIG. 1, in accordance with some embodiments of the present disclosure. In some embodiments, the patterned first polysilicon layer 218 and the patterned first dielectric layer 216 are formed using the patterned photoresist layer 220 as a hard mask. In some embodiments, the first polysilicon layer 218 and the first dielectric layer 216 are etched using at least one of the following etching method, including dry etching and wet etching.

In some embodiments, the patterned photoresist layer 220 is then removed. In some embodiments, the patterned photoresist layer 210 may be removed by one or more chemical cleaning processes using acetone, 1-Methyl-2-pyrrolidon (NMP), Dimethyl sulfoxide (DMSO), or other suitable removing chemicals. In some embodiments, the chemicals used may need to be heated to temperatures higher than room temperature to effectively dissolve the patterned photoresist layer 220. The selection of the remover is determined by the type and chemical structure of the patterned photoresist layer 220, the first polysilicon layer 218, as well as the first dielectric layer 216 to assure the chemical compatibility of these layers with the chemical cleaning process. In some embodiments, this cleaning process is then followed by a rinsing process using isopropyl alcohol or the like, followed by rinsing using deionized water. As a result of this process, the gate terminal structure is formed in the second region 206 of the substrate 202.

Figure 2F:
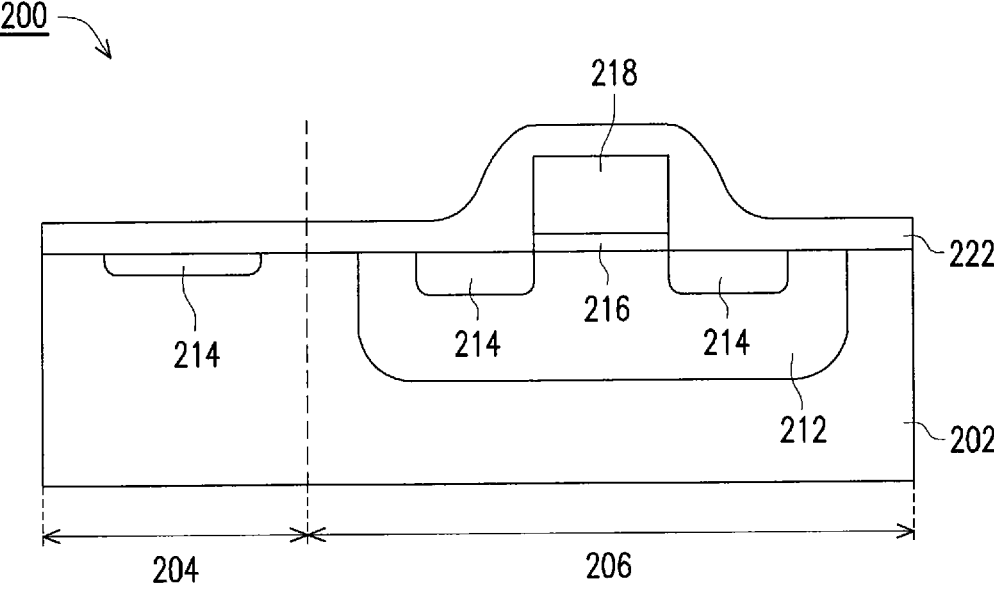

FIG. 2F is a cross-sectional view of the semiconductor device 200 including a second dielectric layer 222 at one of the various stages of fabrication that corresponds to operation 110 of FIG. 1, in accordance with some embodiments of the present disclosure. In some embodiments, the second dielectric layer 222 is deposited on at least a portion of the substrate 202, over the first dielectric layer 216 and the patterned first polysilicon layer 218. In some embodiments, the second dielectric layer 222 comprises silicon oxide. In some embodiments, the second dielectric layer 222 is deposited using a thermal oxidation process. In some embodiments, the second dielectric layer 222 has a thickness in a range of 40~60 nanometers.

Figure 2G:
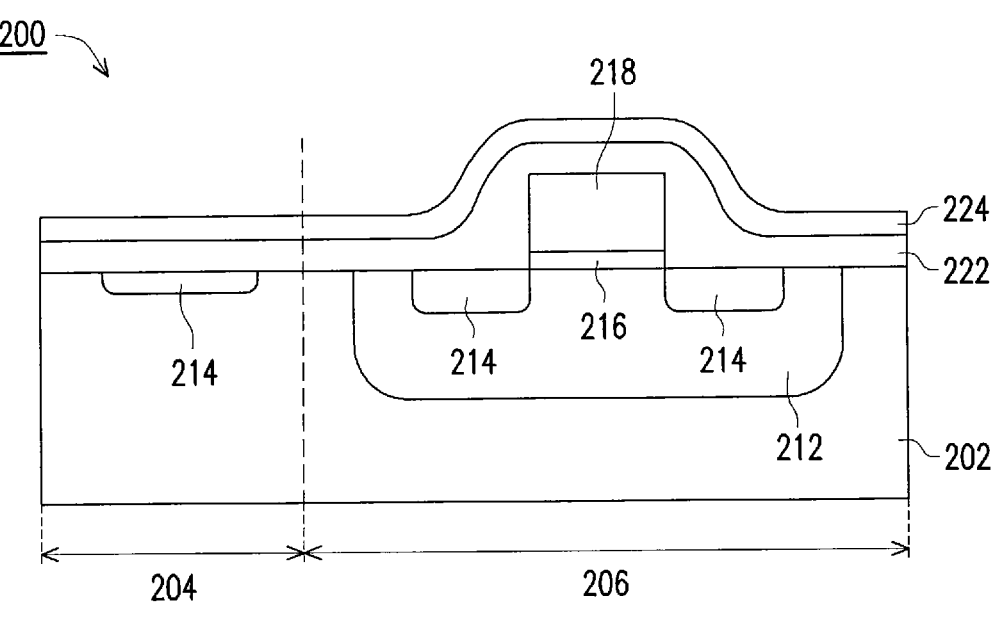

FIG. 2G is a cross-sectional view of the semiconductor device 200 including the second dielectric layer 222 and a second polysilicon layer 224 at one of the various stages of fabrication that corresponds to operation 112 of FIG. 1, in accordance with some embodiments of the present disclosure. In some embodiments, the second polysilicon layer 224 is deposited under the first deposition condition, wherein the first deposition condition comprises the first temperature. In some embodiments, the first temperature is in a range of 600-700 degree Celsius. In some embodiments, a first grain size in a range of 1-1000 micrometers in the second polysilicon layer 224 deposited at the first temperature is larger than a second grain size in the second polysilicon layer 224 when deposited at a second temperature lower than the first temperature and annealed during a following EPI process with a typical temperature range of 650-950 degree Celsius, which is discussed in detail below. In some embodiments, the second grain size of the second polysilicon layer 224 when fabricated at the second temperature is in a range of less than 1 micrometers. In some embodiments, the second polysilicon layer 224 has a thickness in a range of 40-60 nanometers (nm). In some embodiments, if the thickness of the polysilicon layer 224 is less than 40 nm, the surface of the polysilicon layer may become rugged or rough, resulting in a poor quality polysilicon layer, while thicknesses larger than 60 nm may unduly increase deposition time and costs. In some embodiments, the second dielectric layer 222 and the second polysilicon layer 224 are for protection of the patterned first polysilicon layer 218 in the second region 206 during fabrication processes in the first region 204 as described in detail below. In some embodiments, the second temperature, which is higher than the first temperature, is applied so as to from the second polysilicon layer 224 with a larger grain size which does not recrystallize during later processes to introduce defects (e.g., voids).

Figure 2H:
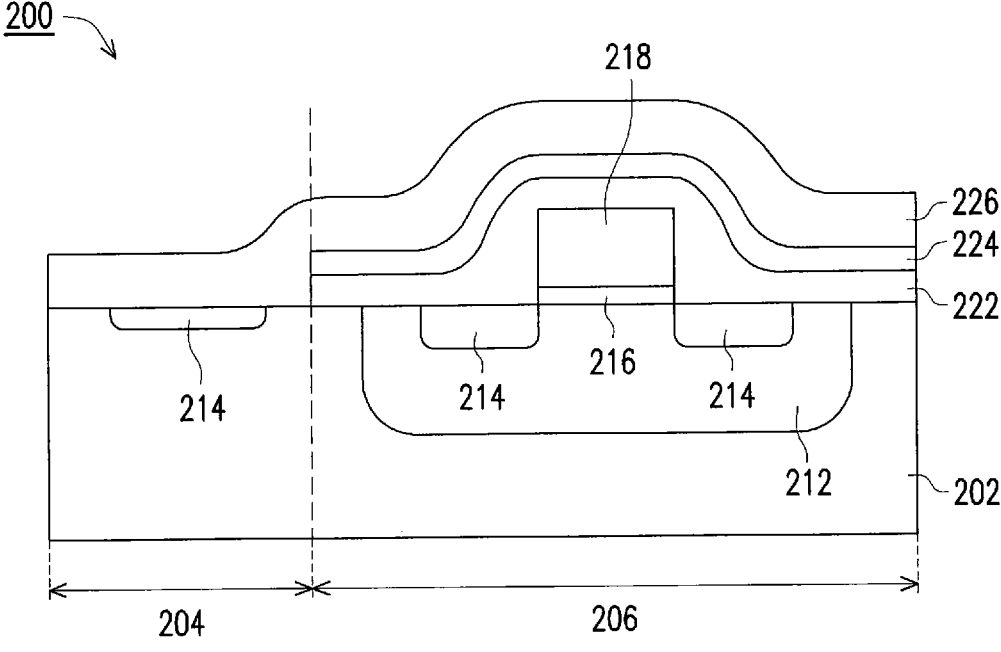

FIG. 2H is a cross-sectional view of the semiconductor device 200 including a patterned second dielectric layer 222, a patterned second polysilicon layer 224, and an epitaxial layer 226 at one of the various stages of fabrication that corresponds to operations 114 and 116 of FIG. 1, in accordance with some embodiments of the present disclosure. In the illustrated embodiments, the second polysilicon layer 224 and the second dielectric layer 222 are patterned through a photolithography process using a patterned photoresist layer (not shown) as a hard mask. In some embodiments, at least a portion of the substrate 202 and at least one conductive feature 212/214 in the first region 204 is exposed for fabrication of at least one BJT device.

In some embodiments, the epitaxial (EPI) layer 226 comprises silicon. In some embodiments, the EPI layer 226 is deposited after removing the patterned photoresist layer for patterning the second polysilicon layer 224 and the second dielectric layer 222. In some embodiments, the EPI layer 226 is deposited on the exposed portion of the substrate 202 in the first region 204 and the surface of the second polysilicon layer 224. In some embodiments, the EPI layer 226 is deposited using a silicon epitaxial process at a temperature range of 650-950° C. In some embodiments, the EPI layer 226 is treated at 850 degree Celsius in a hydrogen (H2) environment for native oxide removal before silicon deposition. In some embodiments, the second polysilicon layer 224 deposited at the first temperature does not recrystallize during the hydrogen treatment process of the EPI layer 226, thus defective voids which may be formed when the second polysilicon layer 224 recrystallizes can be effectively prevented. In some embodiments, defects in the EPI layer 226 caused by the defective voids in the second polysilicon layer 224 can be reduced. In some embodiments, the EPI layer 226 is deposited on the surface of the second polysilicon layer 224 having a surface roughness in the range of 6.00 to 6.25 nanometers (nm) and the EPI layer has a surface roughness in the range of 5.75 to 6.00 nm. On the other hand, an EPI layer deposited on the surface of the second polysilicon layer 224 deposited at the first temperature has a surface roughness in the range of 7.00 to 7.25 nm.

Figure 2I:
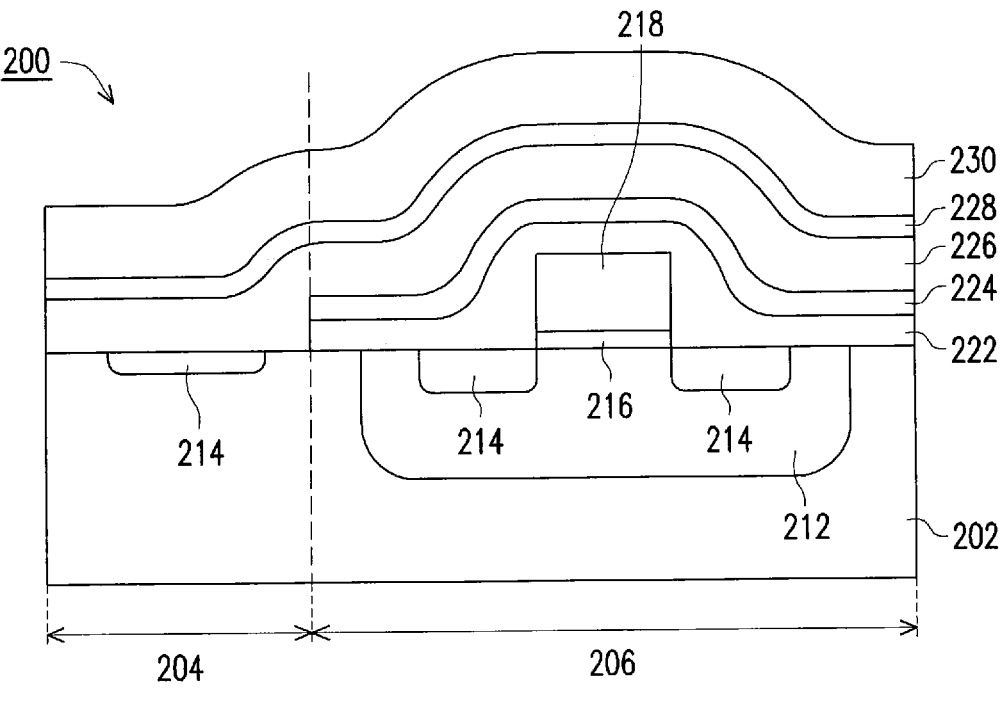

FIG. 2I is a cross-sectional view of the semiconductor device 200 including the EPI layer 226, a third dielectric layer 228, and a third polysilicon layer 230, at one of the various stages of fabrication that corresponds to operation 118 of FIG. 1, in accordance with some embodiments of the present disclosure. In some embodiments, the third dielectric layer 228 comprises silicon oxide formed using a plasma enhanced chemical vapor deposition (PECVD) process-on the surface of the EPI layer 226. In some embodiments, the third polysilicon layer 230 is further deposited on the surface of the third dielectric layer 228 using a furnace CVD. In some embodiments, the third polysilicon layer 230 is deposited under a second deposition condition, wherein the second deposition condition comprises a second temperature. In some embodiments, the second temperature is in a range of 540-560 degree Celsius, which is lower than the first temperature for the deposition of the first and the second polysilicon layers 218/224.

Figure 2J:
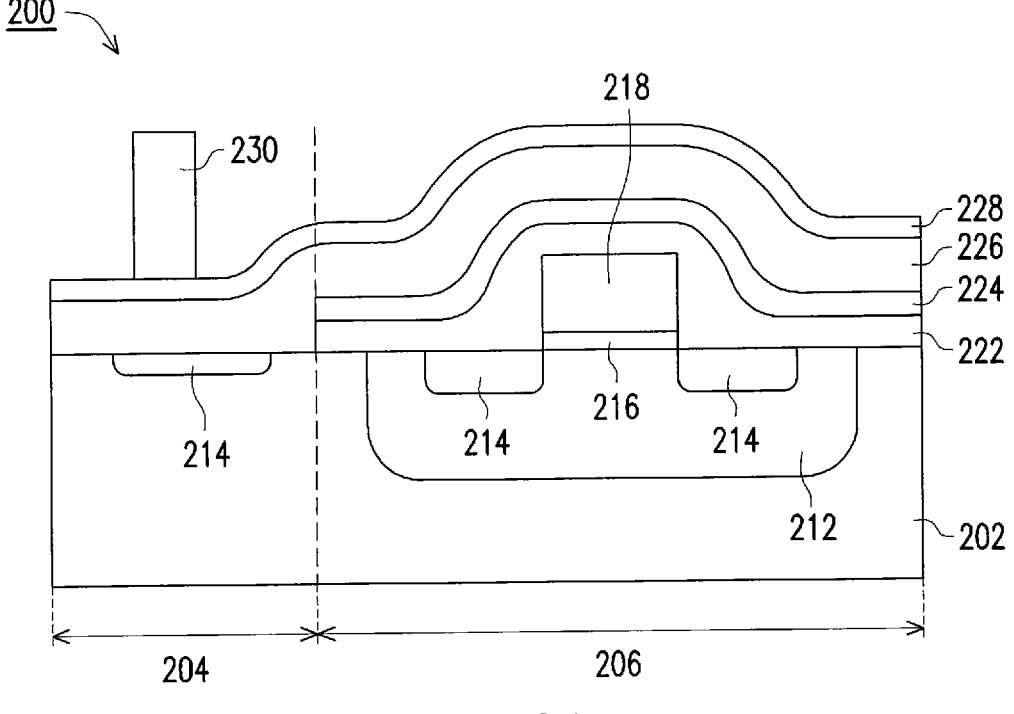

FIG. 2J is a cross-sectional view of the semiconductor device 200 including a patterned third polysilicon layer 230, at one of the various stages of fabrication that corresponds to operation 120 of FIG. 1, in accordance with some embodiments of the present disclosure. In the illustrated embodiments, the third polysilicon layer 230 is patterned through a photolithography process using a patterned photoresist layer (not shown) as a hard mask. In some embodiments, the third polysilicon layer 230 is patterned using a dry etching process. In some embodiments, the patterned third polysilicon layer 230 is aligned with the conductive feature 212/214 in the first region 206 of the substrate 202.

In some embodiments, due to the reduced defective voids in the second polysilicon layer 224 and thus the defects in the EPI layer 226, the etching process for patterning the third polysilicon layer 230 reduces further damage to the EPI layer 226 or the second polysilicon layer 224 in comparison with other approaches.

Figure 2K:
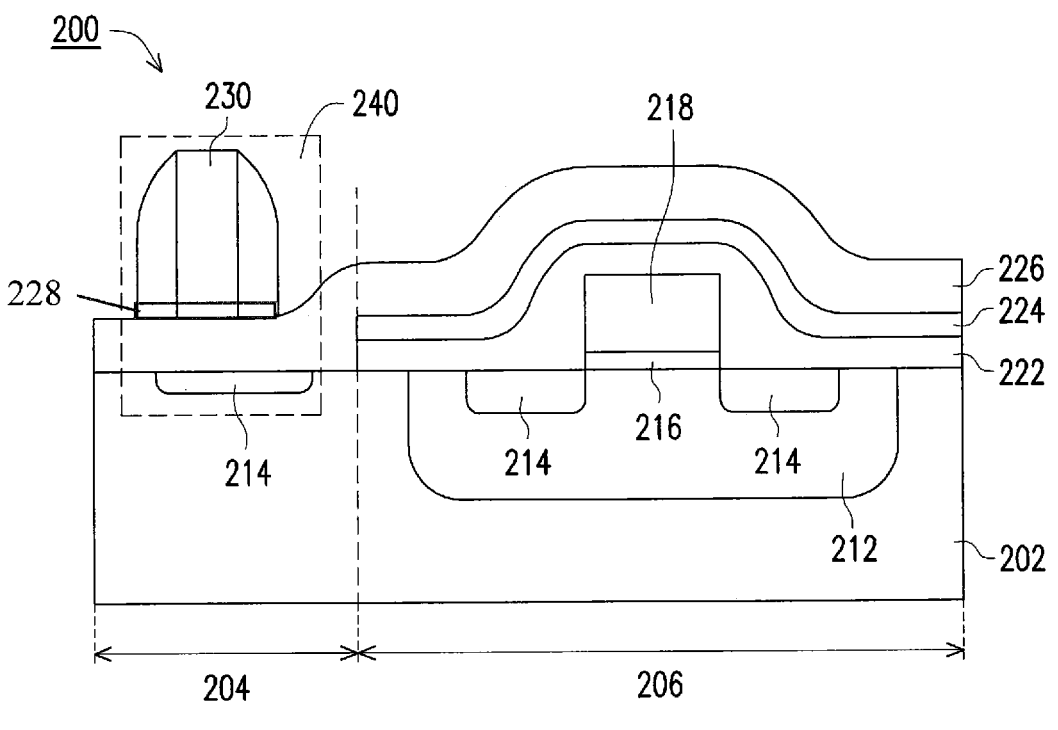

FIG. 2K is a cross-sectional view of the semiconductor device 200 including a BJT device 240, at one of the various stages of fabrication that corresponds to operation 122 of FIG. 1, in accordance with some embodiments of the present disclosure. In some embodiments, the BJT 240 device comprises a fabrication of an emitter terminal and a spacer. In some embodiments the exposed third dielectric layer 228 is removed using a buffered oxide etching (BOE) process.

Figure 2L:
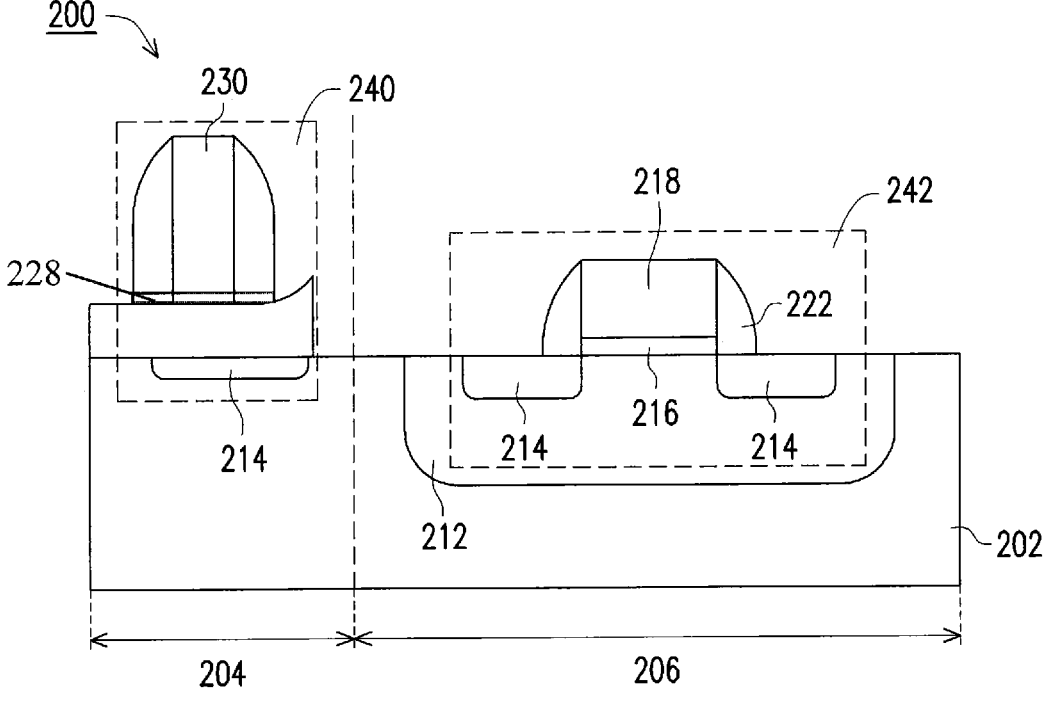

FIG. 2L is a cross-sectional view of the semiconductor device 200 including patterned EPI layer 226, at one of the various stages of fabrication that corresponds to operations 124 and 126 of FIG. 1, in accordance with some embodiments of the present disclosure. In the illustrated embodiments, the EPI layer 226 is patterned through a photolithography process using a patterned photoresist layer (not shown) as a hard mask. In some embodiments, the EPI layer 226 is patterned using a dry etching process. In some embodiments, the patterned EPI layer 226 is aligned with the conductive feature 212/214 in the first region 206 of the substrate 202. In some embodiments, due to the reduced defective voids in the second polysilicon layer 224 and thus the defects in the EPI layer 226, the etching process for patterning the EPI layer 226 does not create further damages to the first polysilicon layer 218 as a part of the gate terminal structure of a CMOS device 242 in the second region 206 of the substrate 202. In the illustrated embodiment, the second polysilicon layer 224 and the second dielectric layer 222 are further removed and etched to form the CMOS device 242.

Figure 3A:
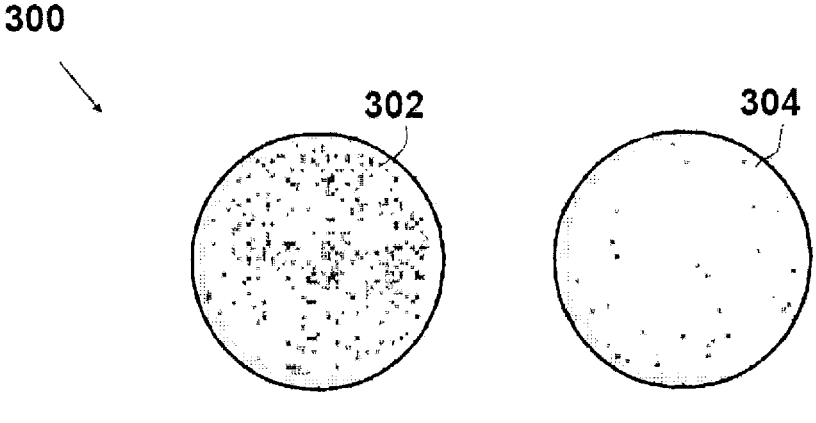
FIG. 3A illustrates defect mappings of two wafers with two different protective polysilicon layers prepared at different temperatures, in accordance with some embodiments of the present disclosure.

FIG. 3A illustrates defect mappings 300 of two wafers with two protective polysilicon layers, in accordance with some embodiments of the present disclosure. In the illustrated embodiment, the defect mapping is measured electrically by performing a function test and leakage test at room temperature (about 25 degree Celsius) on a plurality of devices on the two wafers. In the illustrated embodiment, each defective device is represented as a dot in the defect mapping. In some embodiments, a first wafer 302 comprises a protective polysilicon layer that is deposited at a second temperature in the range of 540 to 560 (e.g., 550) degrees Celsius and a second wafer 304 comprises a protective polysilicon layer that is deposited at a first temperature in the range of 610 to 630 (e.g., 620) degrees Celsius. In the illustrated embodiments, a second percentage of defective devices in the second wafer is smaller than a first percentage of defective devices in the first wafer. In some embodiments, the second percentage of defective devices in the second wafer that fail the function test and/or the leakage test ranges from about 0% to about 2%.

Figure 3B:
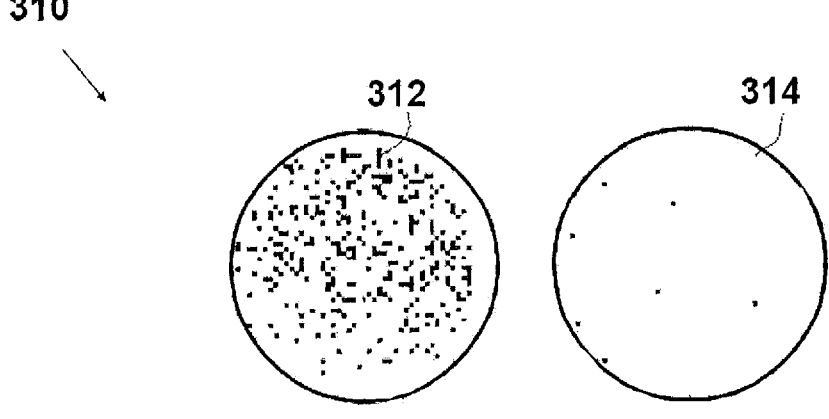
FIG. 3B illustrates defect mappings of two wafers with two different protective polysilicon layers prepared at different temperatures, in accordance with some embodiments of the present disclosure.

FIG. 3B illustrates defect mappings 310 of two wafers with two protective polysilicon layers, in accordance with some embodiments of the present disclosure. In the illustrated embodiment, the defect mapping is measured electrically by performing a leakage test at 85 degree Celsius on a plurality of devices on the two wafers. In the illustrated embodiment, each defective device is represented as a dot in the defect mapping. In some embodiments, a first wafer 312 comprises a protective polysilicon layer that is deposited at a second temperature of 550 degree Celsius and a second wafer 314 comprises a protective polysilicon layer that is deposited at a first temperature of 620 degree Celsius. In the illustrated embodiments, a second percentage of defective devices in the second wafer is smaller than a first percentage of defective devices in the first wafer. In some embodiments, the second percentage of defective devices in the second wafer that fail the leakage test ranges from about 0% to about 0.5%.

In one embodiment, a method for forming a semiconductor device, includes: depositing a protective coating on a first polysilicon layer; forming an epitaxial layer on the protective coating; and depositing a second polysilicon layer over the epitaxial layer, wherein the protective coating comprises a third polysilicon layer, wherein the third polysilicon layer is deposited at a first temperature in a range of 600-700 degree Celsius, and wherein the third polysilicon layer in the protect coating is configured to protect the first polysilicon layer when the second polysilicon layer is etched. In some embodiments, it has been found that deposition temperatures greater than 600 degrees Celsius can prevent re-crystallization of the polysilicon layer while temperatures exceeding 700 degrees Celsius are generally not necessary to further prevent re-crystallization.

In another embodiment, a method for forming a semiconductor device, includes: depositing a protective coating on a first polysilicon layer in a first transistor; forming an epitaxial layer on the protective coating for a second transistor; and depositing a second polysilicon layer over the epitaxial layer for the second transistor, wherein the protective coating comprises a third polysilicon layer, wherein the polysilicon layer is deposited at a first temperature in a range of 600-700 degree Celsius, and wherein the third polysilicon layer in the protect coating is configured to protect the first polysilicon layer of the first transistor when the second transistor is formed. to protect the first polysilicon layer of the first transistor when the second transistor is formed.

Yet, in another embodiment, a method for forming a semiconductor device, includes: depositing a first dielectric layer on a first polysilicon layer on a substrate; depositing a second polysilicon layer on the first dielectric layer at a first temperature; patterning the first dielectric layer and the second polysilicon layer; forming an epitaxial layer on the second polysilicon layer and on the substrate at a second temperature; depositing a second dielectric layer over the epitaxial layer; depositing a third polysilicon layer on the second dielectric layer; patterning the third polysilicon layer to remove at least a portion of the third polysilicon layer; patterning the epitaxial layer to remove at least a portion of the epitaxial layer on the second polysilicon layer; and etching away the second polysilicon layer, wherein the first temperature is in a range of 600 and 700 degree Celsius, wherein the second temperature is in a range of 650-950 degree Celsius, and wherein the second polysilicon layer is configured to protect the first polysilicon layer when the third polysilicon layer is patterned.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:
providing a substrate having at least one conductive element formed therein;
depositing a first dielectric layer on the substrate;
depositing a first polysilicon layer above the first dielectric layer;
patterning the first dielectric layer and the first polysilicon layer to form a gate structure of a Complementary Metal Oxide Semiconductor (CMOS) device;
depositing a second dielectric layer over the patterned first dielectric layer and the first polysilicon layer;
depositing a second polysilicon layer over the second dielectric layer, wherein the second polysilicon layer is deposited at a first temperature in a range of 600 degrees Celsius to 700 degrees Celsius;
patterning the second dielectric layer and the second polysilicon layer; and
depositing an epitaxial layer over the patterned second dielectric layer and the second polysilicon layer, wherein the epitaxial layer is treated at a second temperature in a hydrogen environment, wherein the second temperature is higher than the first temperature.

2. The method of claim 1, wherein the first polysilicon layer is deposited at the first temperature.

3. The method of claim 1, wherein the first dielectric layer comprises silicon oxide.

4. The method of claim 1, wherein the second temperature is in a range of 650 degrees Celsius to 950 degrees Celsius.

5. The method of claim 1, further comprising:
depositing a third dielectric layer on the epitaxial layer; and
depositing a third polysilicon layer on the third dielectric layer, wherein the third polysilicon layer is deposited at a third temperature in a range of 540 degrees Celsius to 560 degrees Celsius.

6. The method of claim 5, wherein the third polysilicon layer has a thickness in a range of 40 nanometers to 60 nanometers.

7. The method of claim 5, further comprising:
patterning the epitaxial layer to remove at least a portion of the epitaxial layer on the second polysilicon layer;
etching away the second polysilicon layer; and
patterning the third dielectric layer and third polysilicon layer to form a gate of a transistor.

8. The method of claim 7, wherein the transistor is a Bipolar Junction Transistor (BJT).

9. The method of claim 5, wherein the second polysilicon layer is configured to protect the first polysilicon layer when the third polysilicon layer is patterned.

10. A method for forming a semiconductor device, comprising:
depositing a first dielectric layer on a substrate having at least one conductive element formed therein;
depositing a first polysilicon layer above the first dielectric layer;
patterning the first dielectric layer and the first polysilicon layer to form a gate structure of a Complementary Metal Oxide Semiconductor (CMOS) device;
depositing a second dielectric layer over the patterned first dielectric layer and the first polysilicon layer;
depositing a second polysilicon layer over the second dielectric layer, wherein the second polysilicon layer is deposited at a first temperature in a range of 600 degrees Celsius to 700 degrees Celsius;

patterning the second dielectric layer and the second polysilicon layer; and depositing an epitaxial layer over the patterned second dielectric layer and the second polysilicon layer, wherein the epitaxial layer is treated at a second temperature in a hydrogen environment, wherein the second temperature is higher than the first temperature.

11. The method of claim 10, wherein the first dielectric layer comprises silicon oxide.

12. The method of claim 10, further comprising:

patterning the epitaxial layer to remove at least a portion of the epitaxial layer on the second polysilicon layer; and etching away the second polysilicon layer.

13. The method of claim 10, further comprising:

depositing a third dielectric layer on the epitaxial layer; and depositing a third polysilicon layer on the third dielectric layer, wherein the second temperature is in a range of 650 degrees Celsius to 950 degrees Celsius, and wherein the third polysilicon layer is deposited at a third temperature in a range of 540 degrees Celsius to 560 degrees Celsius.

14. The method of claim 13, further comprising patterning the third dielectric layer and third polysilicon layer.

15. The method of claim 10, wherein the first polysilicon layer is deposited at the first temperature.

16. The method of claim 10, wherein the second polysilicon layer has a thickness in a range of 40 nanometers to 60 nanometers.

17. A method for forming a semiconductor device, comprising:

providing a substrate having at least one conductive element formed therein;

depositing a first dielectric layer on the substrate;

depositing a first polysilicon layer above the first dielectric layer;

patterning the first dielectric layer and the first polysilicon layer to form a gate structure of a Complementary Metal Oxide Semiconductor (CMOS) device;

depositing a second dielectric layer over the patterned first dielectric layer and the first polysilicon layer;

depositing a second polysilicon layer over the second dielectric layer, wherein the second polysilicon layer is deposited at a first temperature in a range of 600 degrees Celsius to 700 degrees Celsius;

patterning the second dielectric layer and the second polysilicon layer; and depositing an epitaxial layer over the patterned second dielectric layer and the second polysilicon layer, wherein the epitaxial layer is treated at a second temperature in a hydrogen environment, wherein the second temperature is different from the first temperature.

18. The method of claim 17, wherein the first polysilicon layer is deposited at the first temperature.

19. The method of claim 17, wherein the second temperature is in a range of 650 degrees Celsius to 950 degrees Celsius.

20. The method of claim 17, further comprising:

depositing a third dielectric layer on the epitaxial layer; and depositing a third polysilicon layer on the third dielectric layer, wherein the third polysilicon layer is deposited at a third temperature in a range of 540 degrees Celsius to 560 degrees Celsius.

* * * * *